United States Patent
Kim et al.

(10) Patent No.: US 9,354,484 B2
(45) Date of Patent: May 31, 2016

(54) TERAHERTZ CONTINUOUS WAVE EMITTING DEVICE

(71) Applicant: Electronics and Telecommunications Research Institute, Daejeon (KR)

(72) Inventors: Nam Je Kim, Daejeon (KR); Kyung Hyun Park, Daejeon (KR); Sang Pil Han, Daejeon (KR); Ki Won Moon, Pohang-si (KR); Jeong Woo Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/481,176

(22) Filed: Sep. 9, 2014

(65) Prior Publication Data
US 2015/0090906 A1 Apr. 2, 2015

(30) Foreign Application Priority Data

Sep. 30, 2013 (KR) .................. 10-2013-0116502
Mar. 13, 2014 (KR) .................. 10-2014-0029610

(51) Int. Cl.
*G02F 1/35* (2006.01)
*G21K 5/00* (2006.01)
*H01L 31/173* (2006.01)

(52) U.S. Cl.
CPC .............. *G02F 1/353* (2013.01); *G02F 1/3534* (2013.01); *H01L 31/173* (2013.01); *G02F 2203/13* (2013.01)

(58) Field of Classification Search
CPC ........ H04B 10/00; H04B 10/801; G21K 5/00; G21K 5/02; G02F 1/35; G02F 1/3501; G02F 1/353; G02F 1/365; G02F 1/37; G02F 1/377
USPC ............. 250/493.1, 494.1, 503.1, 504 R
See application file for complete search history.

(56) References Cited

U.S. PATENT DOCUMENTS

| | | | | |
|---|---|---|---|---|
| 5,479,539 A | * | 12/1995 | Goldsmith et al. | 385/14 |
| 6,226,309 B1 | * | 5/2001 | Tsubota | 372/49.01 |
| 8,599,893 B2 | | 12/2013 | Kim et al. | |
| 2006/0085160 A1 | * | 4/2006 | Ouchi | G01N 21/3581 702/150 |
| 2007/0091944 A1 | * | 4/2007 | Ruiz | H04B 10/503 372/22 |
| 2008/0316589 A1 | * | 12/2008 | Lealman | 359/328 |
| 2011/0149368 A1 | | 6/2011 | Kim et al. | |
| 2012/0147907 A1 | * | 6/2012 | Kim | H01S 5/06258 372/4 |
| 2014/0264681 A1 | * | 9/2014 | Demers | H01Q 1/2283 257/431 |

FOREIGN PATENT DOCUMENTS

| | | |
|---|---|---|
| KR | 10-1999-0052159 A | 7/1999 |
| KR | 10-2005-0024303 A | 3/2005 |
| KR | 10-2011-0069453 A | 6/2011 |
| KR | 10-2012-0065808 A | 6/2012 |
| WO | WO-03/102518 A2 | 12/2003 |

* cited by examiner

*Primary Examiner* — Michael Logie
*Assistant Examiner* — David E Smith
(74) *Attorney, Agent, or Firm* — Rabin & Berdo, P.C.

(57) ABSTRACT

Provided herein is terahertz continuous wave emitting device having: a plurality of laser light sources generating a plurality of laser lights; and an absorption area formed between the plurality of laser light sources in order to adjust interaction of the plurality of laser lights, wherein the absorption area is configured to have a photo diode, an antenna integrated into the photo diode.

6 Claims, 2 Drawing Sheets

TERAHERTZ CONTINUOUS WAVE EMITTING DEVICE

CROSS-REFERENCE TO RELATED APPLICATIONS

This application claims the benefit of priority under 35 U.S.C. §119(a) of Korean Patent Application Nos. 10-2013-0116502, filed on Sep. 30, 2013 and 10-2014-0029610, filed on Mar. 13, 2014, in the Korean Intellectual Property Office, the entire disclosure of which is incorporated herein by reference for all purposes.

BACKGROUND

1. Field

The following description relates to a terahertz continuous wave emitting device, for example, to a terahertz continuous wave emitting device wherein an absorption area is formed between a plurality of light sources in a 'configuration having a photo diode that is operable at high speed', and wherein an antenna is integrated into the absorption area, whereby the terahertz continuous wave emitting device can be manufactured in a single device.

2. Description of Related Art

Due to new characteristics of a terahertz (THz) wave having a frequency of 0.1 THz~10 THz and thus being harmless to humans due to its low energy, and numerous molecules having a unique spectrum in this band, much research is being conducted on terahertz continuous waves.

Time-domain spectroscopy (TDS) systems using femtosecond (fs) lasers have been mainly used in researches so far. TDS system is a method of exciting a carrier in a photoconductive switch using femtosecond lasers. Herein, the photoconductive switch is made of a material having a very short carrier lifetime, and thus, using this material, the photoconductive switch plays a role of enabling a femtosecond grade pulsed shape current to flow. Therefore, by such a photoconductive switch, a pulsed shape current would flow in an integrated antenna, generating broadband terahertz waves that are to be spread in the air. Ultimately, TDS system is basically a method using pulsed shape THz waves.

However, a disadvantage of fs-lasers is that they are too big and expensive. Not only that, for applications used in industrial fields, small and portable systems that could obtain results from frequency bands that use THz continuous waves (CW THz) rather than time domain spectroscopy are more useful.

For this reason, photomixing method that uses a photomixer and lasers having two different frequencies is being studied for field application and realization of subminiature systems.

Photomixing is basically a method of using a beating light made from two different laser lights. More specifically, photomixing is a method of generating a beating light of a terahertz frequency with laser lights of two different frequencies, generating an alternating current of a terahertz frequency in a photomixer using the generated beating light, and enabling the antenna integrated in the photomixer to emit terahertz waves. The frequency of the terahertz waves generated by such a photomixing method is the same as the frequency of the beating light, and consequently the same as the wavelength difference between the two lasers. Therefore, according to this photomixing method, it is possible to adjust one of the two laser wavelengths and make a Terahertz wave emitter capable of frequency tuning.

Meanwhile, terahertz continuous wave (CW THz) emitting systems that are currently being sold for industrial uses are configured to use two independent lasers and one independent photomixer. More specifically, as in FIG. 1, a terahertz continuous wave emitting system is configured such that two independent lasers having different frequencies generate a beating light of a terahertz frequency, and then the generated beating light is irradiated upon an 'independent photomixer'.

However, there is a problem that in such a terahertz continuous wave emitting system, the beating light generated by two independent lasers leak outside the device and is then irradiated upon an independently configured photomixer, and thus light loss may occur in the process. Furthermore, since such a terahertz continuous wave emitting system is embodied to comprise a plurality of independent devices(two independent lasers, and one photomixer independent from the two independent lasers), there is a problem of limitation to simplifying the structure of the system.

Therefore, there is a need for a new technology of emitting terahertz continuous waves that can be differentiated from such an terahertz continuous wave emitting system aforementioned.

SUMMARY

Therefore, a purpose of the exemplary embodiments is to provide a terahertz continuous wave emitting device that may be formed as a single device using optical device integration technology.

It will be understood that the technical tasks intended for the exemplary embodiments to achieve are not limited to the aforementioned technical tasks, but various technical tasks may be included within the scope obvious to those skilled in the art based on the following description.

In one general aspect, there is provided a terahertz continuous wave emitting device comprising: a plurality of laser light sources generating a plurality of laser lights; and an absorption area formed between the plurality of laser light sources in order to adjust interaction of the plurality of laser lights, wherein the absorption area is configured to have a photo diode, and an antenna integrated into the photo diode.

In the general aspect of the terahertz continuous wave emitting device, the absorption area may be provided with a photo diode generating a current based on a beating light; and a waveguide structure for extracting an RF signal generated in the photo diode.

The terahertz continuous wave emitting device may be formed as a single device, emitting a terahertz continuous wave using a light made by beating inside the single device.

In the general aspect of the terahertz continuous wave emitting device, the absorption area may enable a light having a stable beat frequency to be generated, while operating as a port for generating a terahertz continuous wave.

In the general aspect of the terahertz continuous wave emitting device, the absorption area may be provided with a photo diode generating a current based on a beating light; and a plurality of terahertz antennae disposed to be facing one another, and emitting a Terahertz continuous wave.

In the general aspect of the terahertz continuous wave emitting device, the plurality of laser light sources may generate laser lights having different wavelengths.

In the general aspect of the terahertz continuous wave emitting device, the plurality of laser light sources may comprise a first laser light source generating a laser light having a first wavelength; and a second laser light source generating a laser light having a second wavelength.

In the general aspect of the terahertz continuous wave emitting device, the first laser light source or the second laser light source may be embodied by a DFB LD(Distributed Feedback Laser Diode).

In another general aspect, there is provided a method of emitting a terahertz continuous wave, the method comprising: a plurality of laser lights generated by a plurality of laser light sources being made by beating in an absorption area formed between the plurality of laser light sources; and a photo diode formed in the absorption area generating a current using the beating light.

The exemplary embodiments may embody a 'single device' type terahertz continuous emitting device. There exists a terahertz continuous wave emitting system of related art integrated into a single substrate, but such a system is formed by configuring a plurality of laser lights and a photomixer independently, and thus it is not a single device type system but numerous devices merely integrated into a single device. In other words, it can be seen as an effort to form a small system, rather than an effort to form a single device physically. On the other hand, according to the exemplary embodiments, it is possible to integrate a plurality of laser light sections and photomixer sections, thereby embodying a single device type terahertz continuous wave emitting device. Therefore, it is possible to significantly simplify the structure of the system, and embody a device of a basic unit that enables practical utilization of terahertz continuous waves.

Furthermore, the exemplary embodiments may emit terahertz continuous waves based on beating lights that is more stabilized and has a greater intensity than beating lights of related art. More specifically, unlike a system of related art that requires a 'process of letting beating lights leak outside and then irradiating the beating lights upon an independent photomixer device', in the exemplary embodiments, a beating light generated inside a single device does not leak outside but is directly utilized, and thus it is capable of generating terahertz continuous waves using a beating light that is more stabilized and has a greater intensity. Therefore, unlike in a system of related art, the exemplary embodiments do not cause optical loss, maintain characteristics of internal beating lights being stable from external conditions, and embody characteristics of stable emission of terahertz continuous waves even without additional stabilizing components (heat stabilization, current stabilization).

Meanwhile, it will be understood that effects of the exemplary embodiments are not limited to the aforementioned effects, but may include various effects within the scope obvious to those skilled in the related art.

Other features and aspects may be apparent from the following detailed description, the drawings, and the claims.

Figure 1:
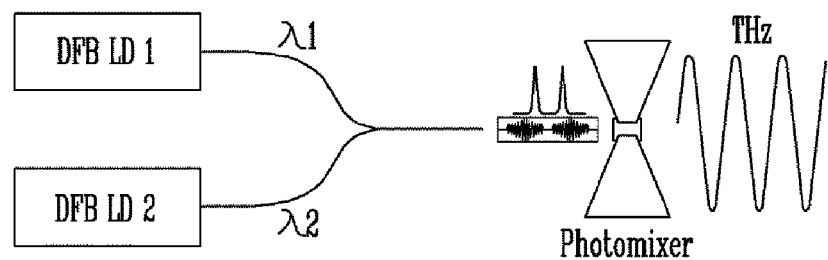
FIG. 1 is an exemplary view illustrating a terahertz continuous wave emitting system of related art.

Throughout the drawings and the detailed description, unless otherwise described, the same drawing reference numerals will be understood to refer to the same elements, features, and structures. The relative size and depiction of these elements may be exaggerated for clarity, illustrating, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Furthermore, it will be understood that the expression 'comprising configurative elements' is an open expression, merely indicating that those configurative elements exist, without excluding possible addition of other configurative elements.

In addition, it will be understood that the expression 'a first, a second' is used for merely differentiating between a plurality of configurative elements, without limitation to any order or other characteristics of the configurative elements.

A terahertz continuous wave emitting device according to an exemplary embodiment is described in general below.

A terahertz continuous wave emitting device according to an exemplary embodiment is characterized in being embodied as a physically 'single device' unlike in related art. More specifically, the exemplary embodiments are characterized in being embodied as one device rather than a device consisting of 'a plurality of independent laser light sources' and 'a photomixer' for emitting terahertz continuous waves.

For this purpose, a terahertz continuous wave emitting device according to an exemplary embodiment embodies an absorption area between the plurality of laser light sources in a 'configuration having a photo diode that is operable at high speed' in order to control interaction of the plurality of laser light sources, and integrates the absorption area together with 'the terahertz antenna that received the current generated by the photo diode'. That is, the terahertz continuous wave emitting device according to an exemplary embodiment integrates the absorption area provided between the plurality of laser light sources with the photomixer in one device. Therefore, unlike in a terahertz continuous wave emitting device of related art, there is no need for a process where a light made by beating in the absorption area between the plurality of laser light sources leak outside and is then irradiated upon an independent photomixer, and thus it is possible to directly utilize the beating light generated inside the single device to emit a terahertz continuous wave.

Hereinbelow is description of a terahertz continuous wave emitting device according to an exemplary embodiment with reference to FIGS. 2 to 4.

Hereinbelow, description is made based on the configurative elements related to the characteristics of the exemplary embodiments, and description on configurations and operations of related art is omitted. Therefore, a terahertz continuous wave emitting device according to an exemplary embodiment does not include only the disclosed configurations, but may also include various additional configurations and detailed configurations within the scope obvious to those skilled in the related art.

Figure 2:
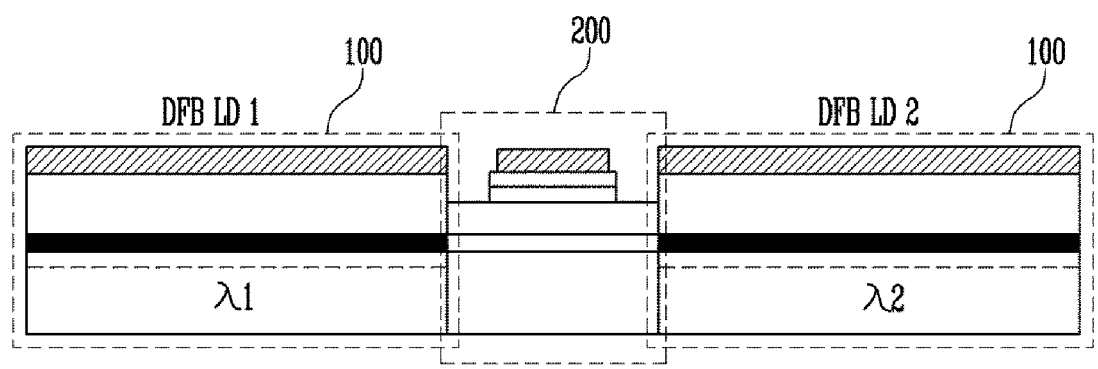
FIG. 2 is a schematic cross-sectional view illustrating a terahertz continuous wave emitting device according to an exemplary embodiment.
Figure 3:
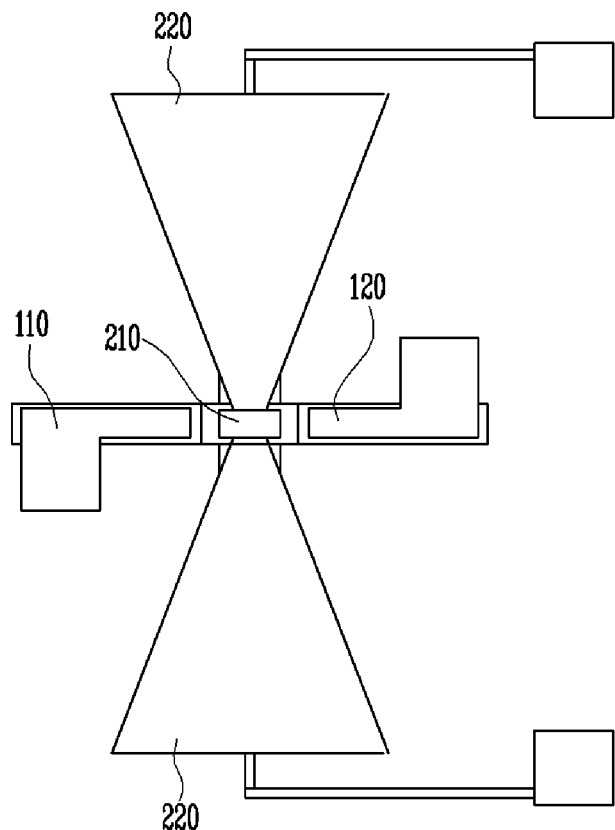
FIG. 3 is a schematic plane view of a terahertz continuous wave emitting device according to an exemplary embodiment.
Figure 4:
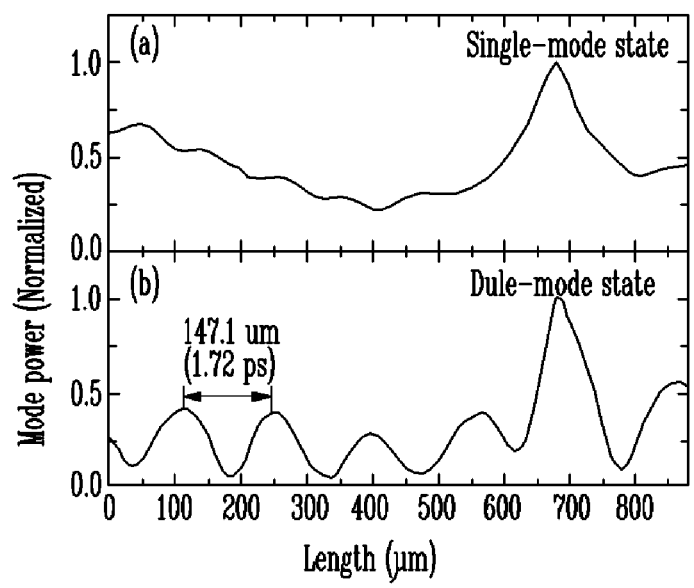
FIG. 4 is a graph illustrating a distribution of internal light intensity when there is an absorption area and when there is no absorption area.

Referring to FIGS. 2 and 3, a terahertz continuous wave emitting device according to an exemplary embodiment comprises a plurality of laser light sources 100 that generate a plurality of laser lights, and an absorption area 200 formed between the plurality of laser light sources to adjust interaction between the plurality of laser lights and where a photo diode (PD) and a terahertz antenna are formed.

The plurality of laser light sources 100 are configured to generate a plurality of laser lights for generating a beating light of a terahertz frequency. These plurality of laser light sources 100 may desirably generate a plurality of laser lights having different wavelengths, and enable a beating light of a terahertz frequency to be generated based on the plurality of laser lights.

For example, the plurality of laser light sources 100 may be configured to comprise a first laser light source 110 that generates a laser light of a first wavelength and a second laser light source 120 generating a laser light of a second wavelength, for a dual mode oscillation. These laser lights generated by the first laser light source 110 and the second laser light source 120 are beaten by each other and generate a beating signal of a terahertz frequency, in which case 'the first laser light source 110, the laser light source 120, and the absorption area 200 are formed in a single device form', thereby configuring a stable resonator as a whole, and accordingly, obtaining a stable terahertz beating light. (b) in FIG. 4 shows a beating light generated inside the device in a case where the first laser light source 110, the second laser light source 120 and the absorption area 200 are formed in a single device form as in FIGS. 2 and 3. As can be seen from (b) in FIG. 4, even when each of the first laser light source 110 and the second laser light source 120 operates in a stable single mode and their outputs are opposite to each other, a stable resonator is formed as a whole, and thus a stable beating light is generated. ((a) in FIG. 4 shows an internal light distribution when there is no absorption area 200. It can be seen that an unstable beating light is generated due to lack of an absorption area.)

Meanwhile, the plurality of laser light sources 100 may be formed as various laser light sources, but they may desirably be embodied by DFB LD (Distributed FeedBack Laser Diode). In this case, each laser light source may be configured to comprise a diffraction lattice and a WaveGuide layer.

The absorption area 200 is an area formed between the plurality of laser light sources. It adjusts interaction of the plurality of laser light sources (phase adjustment or light absorption adjustment), and at the same time, enables a Terahertz continuous wave to be generated based on the beating light generated by the plurality of laser lights.

Such an absorption area 200 may comprise a WaveGuide (WG) layer formed on a substrate. The absorption area 200 may adjust phases of lights generated by the plurality of laser light sources, or adjust light absorption. Therefore, through these operations, the absorption area 200 enables the plurality of laser lights to generate a stable beating light.

In addition, the absorption area 200 may further comprise a photo diode 210 that absorbs a stable beating light of a terahertz frequency and generates a current having the same cycle as the absorbed beating light, and a terahertz antenna 200 emitting terahertz continuous waves based on the current generated by the photo diode. And using theses configurative elements, it is possible to generate a stable beating light inside the area and at the same time, generate terahertz continuous waves using the generated beating light.

Although not illustrated in FIGS. 2 and 3, in an exemplary embodiment, the absorption area 200 may be configured to comprise a Wave guide structure for extracting an RF signal that is generated in the photo diode, instead of the terahertz antenna 220.

Consequently, the absorption area 200 plays a role of a port for generating terahertz continuous waves at the same time of generating light having a stable beat frequency. That is, after generating a stable beating signal inside the area, the absorption area 200 does not leak the generated beating signal unlike in related art, but plays the role of a port for generating terahertz continuous waves using the integrated port diode.

Meanwhile, the photo diode 210 formed in the absorption area is desirably formed to be capable of realizing a very fast response speed. More specifically, the photo diode 210 is desirably formed to have a thin absorption layer and a small area size, and to be capable of improving the RF response speed up to hundreds of GHz bands. In addition, the photo diode 210 is desirably formed to be capable of generating a great current having tens of mA, and further, not to show saturated characteristics even when an input light has a great intensity.

In addition, the terahertz antenna 220 formed in the absorption area is desirably integrated together with the photo diode 210, and capable of receiving a current generated by the photo diode 210. As illustrated in FIG. 3, the terahertz antenna 220 may be configured to comprise a structure of two wings facing each other.

The aforementioned terahertz continuous wave emitting device according to an exemplary embodiment is configured to have a structure where a plurality of laser light sources generating a terahertz beating light, an absorption area stabilizing the terahertz beating light, a photo diode absorbing the terahertz beating light and generating a current, and a Terahertz antenna emitting terahertz continuous waves based on the current generated by the photo diode are integrated in one device.

Therefore, the terahertz continuous wave emitting device according to an exemplary embodiment operates such that the plurality of laser light sources, the photo diode, and the terahertz antenna do not operate independently as in related art, but operate at the same time in a single device. More specifically, the terahertz continuous wave emitting device according to an exemplary embodiment enables such that the plurality of laser light sources and the 'absorption area where the photo diode is formed' configure a stable resonator together, a stable terahertz beating light is generated inside the single device, and the generated terahertz beating light is converted into a current by the photo diode at the same time as it is generated (without leakage to outside), and the Terahertz antenna emits terahertz continuous waves based on the generated current.

A method of emitting a terahertz continuous wave according to an exemplary embodiment is described below.

The method of emitting a terahertz continuous wave according to an exemplary embodiment may first comprise an operation where a plurality of laser lights generated by a plurality of laser light sources are beaten in an absorption area (operation a).

In addition, the method of emitting a terahertz continuous wave according to an exemplary embodiment may comprise an operation where a photo diode formed in the absorption area generates a current using a beating light (operation b), after operation a.

Furthermore, the method of emitting a terahertz continuous wave according to an exemplary embodiment may comprise an operation where a terahertz antenna formed in the absorption area emits a terahertz continuous wave based on a current provided from the photo diode (operation c).

The aforementioned method of emitting a terahertz continuous wave according to an exemplary embodiment may comprise substantially the same technical characteristics as the aforementioned 'terahertz continuous wave emitting device', but only in a different category. Therefore, although not described in detail to prevent repeated explanation, the aforementioned characteristics relating to the aforementioned 'terahertz continuous wave emitting device' may obviously be inferred and applied to the aforementioned 'terahertz continuous wave emitting method' as well.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components of their equivalents. Accordingly, other implementations are within the scope of the following claims.

What is claimed is:

1. A terahertz continuous wave emitting device comprising:
    a first laser light source generating a first laser light;
    a second laser light source generating a second laser light;
    a photomixer formed between the first laser light source and the second light source, the photomixer generating a beating light from the first and second laser lights, the photomixer generating a current from the beating light, the photomixer emitting terahertz waves,
    wherein:
    the photomixer is disposed in a linear arrangement with the first and second laser light sources and has two opposite sides which are respectively directly coupled to the first laser light source and the second laser light source, such that the photomixer and the first and second laser light sources collectively form a single device; and
    the photomixer includes:
        an absorption area adjusting interaction of the first and second laser lights, and generating the beating light;
        a photodiode generating the current from the beating light, the photodiode being formed in the absorption area between the first and second laser light sources; and
        an antenna emitting terahertz continuous waves based on the current generated by the photodiode, the antenna integrated into the photodiode and formed between the first and second laser light sources.

2. The device according to claim 1, wherein the first and second laser light sources generate laser lights having different wavelengths.

3. The device according to claim 1, wherein the first laser light source or the second laser light source is embodied by a DFB LD (Distributed Feedback Laser Diode).

4. The device according to claim 1,
    wherein the photodiode of the absorption area has a first side facing the first laser light source and a second side facing the second laser light source.

5. A method of emitting a terahertz continuous wave, the method comprising:
    forming a photomixer between a first laser light source and a second laser light source, such that the photomixer is coupled to the first and second laser light sources, the photomixer is disposed in a linear arrangement with the first and second laser light sources and has two opposite sides which are respectively directly coupled to the first laser light source and the second laser light source, and the photomixer and the first and second laser light sources collectively form a single device, wherein the photomixer consists of an absorption area, a photodiode formed in the absorption area between the first and second laser light sources and an antenna formed between the first and second laser light sources, the antenna being integrated into the photodiode;
    generating a first laser light having a first wavelength by the first laser light source, and generating a second laser light having a second wavelength by the second laser light source;
    generating a beating light by the photomixer through beating the first and second laser lights in the absorption area;
    generating a current by the photomixer at the photodiode using the beating light; and
    emitting a terahertz continuous wave by the photomixer at the antenna using the current provided from the photodiode.

6. The method according to claim 5,
    wherein the photodiode of the absorption area has a first side facing the first laser light source and a second side facing the second laser light source.

* * * * *